United States Patent
Tsai et al.

(10) Patent No.: US 8,531,101 B2
(45) Date of Patent: Sep. 10, 2013

(54) ORGANIC ELECTROLUMINESCENT LIGHTING ELEMENT ARRAY AND ORGANIC ELECTROLUMINESCENT LIGHTING ELEMENT

(75) Inventors: Chih-Hung Tsai, Changhua County (TW); Yuan-Chen Chin, Hsinchu County (TW); Chun-Liang Lin, New Taipei (TW); Chun-Hsiang Fang, Yilan County (TW)

(73) Assignee: Au Optronics Corporation, Hsinchu (TW)

( * ) Notice: Subject to any disclaimer, the term of this patent is extended or adjusted under 35 U.S.C. 154(b) by 20 days.

(21) Appl. No.: 13/330,695

(22) Filed: Dec. 20, 2011

(65) Prior Publication Data

US 2013/0082590 A1 Apr. 4, 2013

(30) Foreign Application Priority Data

Sep. 30, 2011 (TW) .............................. 100135629 A (51) Int. Cl.
*H01L 51/52* (2006.01)
(52) U.S. Cl.
USPC ............................. 313/504; 313/506; 313/509
(58) Field of Classification Search
USPC .................................................. 313/498–512
See application file for complete search history.

(56) References Cited

U.S. PATENT DOCUMENTS

| 8,283,849 B2 * | 10/2012 | Hente et al. ................... 313/503 |
| 2006/0017374 A1 * | 1/2006 | Hasegawa et al. ............ 313/503 |
| 2006/0244371 A1 * | 11/2006 | Cok et al. ...................... 313/506 |
| 2007/0013282 A1 | 1/2007 | Okutani et al. |
| 2010/0033078 A1 | 2/2010 | Lee et al. |
| 2010/0102713 A1 * | 4/2010 | Seo et al. ....................... 313/504 |
| 2010/0127615 A1 * | 5/2010 | Kim et al. ...................... 313/504 |

FOREIGN PATENT DOCUMENTS

| JP | 2007-188778 | 7/2007 |
| JP | 2008-108439 | 5/2008 |
| WO | WO 2010125493 A1 * | 11/2010 |

* cited by examiner

*Primary Examiner* — Donald Raleigh
(74) *Attorney, Agent, or Firm* — Jianq Chyun IP Office (57) ABSTRACT

An organic electroluminescent (OEL) lighting element disposed on a substrate includes a first electrode, a second electrode, an OEL layer, an auxiliary electrode, a patterned scattering layer, and a patterned dielectric layer. The second electrode is opposite to the first electrode having a first refraction index. The OEL layer is disposed between the first electrode and the second electrode. The auxiliary electrode is disposed between the first electrode and the second electrode, electrically connected to the first electrode, and separated from the OEL layer by a gap. The patterned scattering layer is disposed between the first electrode and the auxiliary electrode, covers the auxiliary electrode, and has a second refraction index greater than or substantially equal to the first refraction index. The patterned dielectric layer is disposed between the auxiliary electrode and the second electrode, covers the auxiliary electrode, and is disposed between the auxiliary electrode and the OEL layer.

18 Claims, 5 Drawing Sheets

ORGANIC ELECTROLUMINESCENT LIGHTING ELEMENT ARRAY AND ORGANIC ELECTROLUMINESCENT LIGHTING ELEMENT

CROSS-REFERENCE TO RELATED APPLICATION

This application claims the priority benefit of Taiwan application serial no. 100135629, filed on Sep. 30, 2011. The entirety of the above-mentioned patent application is hereby incorporated by reference herein and made a part of this specification.

BACKGROUND OF THE INVENTION

1. Field of the Invention

The application relates to a light-emitting element array. More particularly, the application relates to an organic electroluminescent (OEL) lighting element array.

2. Description of Related Art

An organic electroluminescent (OEL) element is an optoelectronic element capable of efficiently converting electric energy into light energy, and the OEL element often serves as an illumination source, a display panel, and so forth. Since the OEL element is characterized by the absence of viewing-angle dependence, simple manufacturing process, low costs, high response speed, wide operating temperature range, and full-color display, the OEL element satisfying the requirement for the multi-media display has become a popular research topic in recent years.

When the OEL element is applied in the field of illumination, the OEL element is often required to be capable of illuminating a large area. In order to provide a sufficient illumination area, manufacturers usually arrange a plurality of OEL lighting elements in arrays in series or in parallel, so as to form an OEL lighting element array. The anode of each of the OEL lighting elements is usually made of a transparent conductive material (e.g., indium tin oxide (ITO)) that often has a relatively high resistance. Nonetheless, when the illumination area is expanded, an issue of voltage drop (IR drop) in the OEL lighting element array often occurs, which leads to uneven brightness of the illuminative OEL lighting element array.

In order to resolve the issue of voltage drop, a metal mesh connected to the transparent anode may be used. However, the metal mesh does not allow light transmission, and thus the location where the metal mesh is disposed may become a dark zone that do not permit light passing through. Moreover, the refraction index of the transparent conductive material including ITO is greater than the refraction index of the substrate which carries the OEL lighting element, and light obliquely emitted from the anode to the substrate is likely to encounter total internal reflection (TIR) due to the difference in the refraction indexes of different materials. As such, the external quantum efficiency of the OEL lighting element array is not satisfactory.

SUMMARY OF THE INVENTION

The application is directed to an organic electroluminescent (OEL) lighting element array that is characterized by satisfactory external efficiency.

The application is further directed to an OEL lighting element array that can resolve the issue of IR drop without sacrificing external efficiency.

The application is directed to an OEL lighting element with an improved external efficiency.

In the application, an OEL lighting element array suitable for being disposed on a substrate is provided. The OEL lighting element array includes a plurality of first electrodes, a patterned scattering layer, a plurality of auxiliary electrodes, a patterned dielectric layer, a plurality of OEL layers, and a plurality of second electrodes. The first electrodes are separately disposed on the substrate, and the first electrodes have a first refraction index. The patterned scattering layer is disposed among the first electrodes on the substrate and located on edge portions of the first electrodes. Besides, the patterned scattering layer has a second refraction index, and the second refraction index is greater than or substantially equal to the first refraction index. The auxiliary electrodes are separately disposed on the patterned scattering layer, and each of the auxiliary electrodes is electrically connected to one of the first electrodes, respectively. The patterned dielectric layer covers the auxiliary electrodes and has a plurality of contact holes. Each of the contact holes respectively exposes one of the auxiliary electrodes. Each of the OEL layers is respectively disposed on one of the first electrodes. The second electrodes are disposed on the OEL layers. Each of the second electrodes is respectively disposed on one of the OEL layers and extends above one of the auxiliary electrodes adjacent thereto, and each of the second electrodes is electrically connected to the one of the auxiliary electrodes adjacent thereto through one of the contact holes.

According to an embodiment of the application, the first electrodes include transparent electrodes.

According to an embodiment of the application, a material of the first electrodes includes indium tin oxide (ITO), indium zinc oxide (IZO), or aluminum zinc oxide (AZO).

According to an embodiment of the application, the patterned scattering layer has a mesh pattern and a plurality of openings. Each of the openings respectively exposes one of the first electrodes, and each of the OEL layers is respectively disposed in one of the openings.

According to an embodiment of the application, the patterned scattering layer scatters lateral light emitted from the OEL layers.

According to an embodiment of the application, a material of the auxiliary electrodes includes a conductive light-shielding material.

According to an embodiment of the application, each of the second electrodes is electrically insulated from one of the first electrodes underlying, and each of the second electrodes is electrically connected to one of the first electrodes adjacent thereto through one of the auxiliary electrodes.

According to an embodiment of the application, a material of the second electrodes includes metal.

According to an embodiment of the application, the OEL lighting element array further includes a passivation layer that covers the second electrodes and the patterned dielectric layer.

In the application, an OEL lighting element array suitable for being disposed on a substrate is provided. The OEL lighting element array includes a pad layer, a plurality of first electrodes, a patterned dielectric layer, a plurality of auxiliary electrodes, a patterned scattering layer, a plurality of OEL layers, and a plurality of second electrodes. The pad layer is disposed on the substrate. The first electrodes are separately disposed on the pad layer and the substrate. The patterned dielectric layer covers the substrate among the first electrodes and is disposed on edge portions of the first electrodes. Here, the patterned dielectric layer has a plurality of first contact holes, and each of the first contact holes respectively exposes one of the first electrodes. The auxiliary electrodes are separately disposed on the patterned dielectric layer, and each of the auxiliary electrodes is electrically connected to a corresponding first electrode of the first electrodes through one of the first contact holes, respectively. The patterned scattering layer is disposed among the first electrodes and covers the auxiliary electrodes. Here, the patterned scattering layer has a plurality of second contact holes, and each of the second contact holes respectively exposes one of the auxiliary electrodes. Each of the OEL layers is respectively disposed on one of the first electrodes. The second electrodes are disposed on the OEL layers and the patterned scattering layer. Each of the second electrodes is respectively disposed on one of the OEL layers and extends above one of the auxiliary electrodes adjacent thereto, and each of the second electrodes is electrically connected to the one of the auxiliary electrodes adjacent thereto through one of the second contact holes.

According to an embodiment of the application, the first electrodes include reflective electrodes.

According to an embodiment of the application, a material of the first electrodes includes metal.

According to an embodiment of the application, the patterned scattering layer has a mesh pattern and a plurality of openings. Each of the openings exposes one of the first electrodes, and each of the OEL layers is respectively disposed in one of the openings.

According to an embodiment of the application, the patterned scattering layer scatters lateral light emitted from the OEL layers.

According to an embodiment of the application, a material of the auxiliary electrodes includes a conductive light-shielding material.

According to an embodiment of the application, each of the second electrodes is electrically insulated from one of the first electrode underlying, and each of the second electrodes is electrically connected to one of the first electrodes adjacent thereto through one of the auxiliary electrodes.

According to an embodiment of the application, a material of the second electrodes includes ITO, IZO, or AZO.

According to an embodiment of the application, the OEL lighting element array further includes a passivation layer that covers the second electrodes and the patterned scattering layer.

In the application, an OEL lighting element suitable for being disposed on a substrate is provided. The OEL lighting element includes a first electrode, a second electrode, an OEL layer, an auxiliary electrode, a patterned scattering layer, and a patterned dielectric layer. The first electrode has a first refraction index. The second electrode is opposite to the first electrode. The OEL layer is disposed between the first electrode and the second electrode. The auxiliary electrode is disposed between the first electrode and the second electrode, electrically connected to the first electrode, and separated from the OEL layer by a gap. The patterned scattering layer is disposed between the first electrode and the auxiliary electrode and covers the auxiliary electrode. Besides, the patterned scattering layer has a second refraction index, and the second refraction index is greater than or substantially equal to the first refraction index. The patterned dielectric layer is disposed between the auxiliary electrode and the second electrode. In addition, the patterned dielectric layer covers the auxiliary electrode and is disposed between the auxiliary electrode and the OEL layer.

Based on the above, the patterned scattering layer described in the embodiments of the application is disposed between the first electrode and the auxiliary electrode of the OEL lighting element, such that the light emitted from the OEL layer can be scattered due to the optical effects achieved by the patterned scattering layer. Thereby, the OEL lighting element array can have satisfactory external efficiency. Moreover, light can also be emitted from a location where the auxiliary electrode is disposed. Thus, the OEL lighting element array has favorable light emission quality, no dark zone exists at the location where the auxiliary electrode is disposed, and light emission is rather even and uniform.

In order to make the aforementioned and other features and advantages of the application more comprehensible, embodiments accompanying figures are described in detail below.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the application.

DESCRIPTION OF EMBODIMENTS

Figure 1:
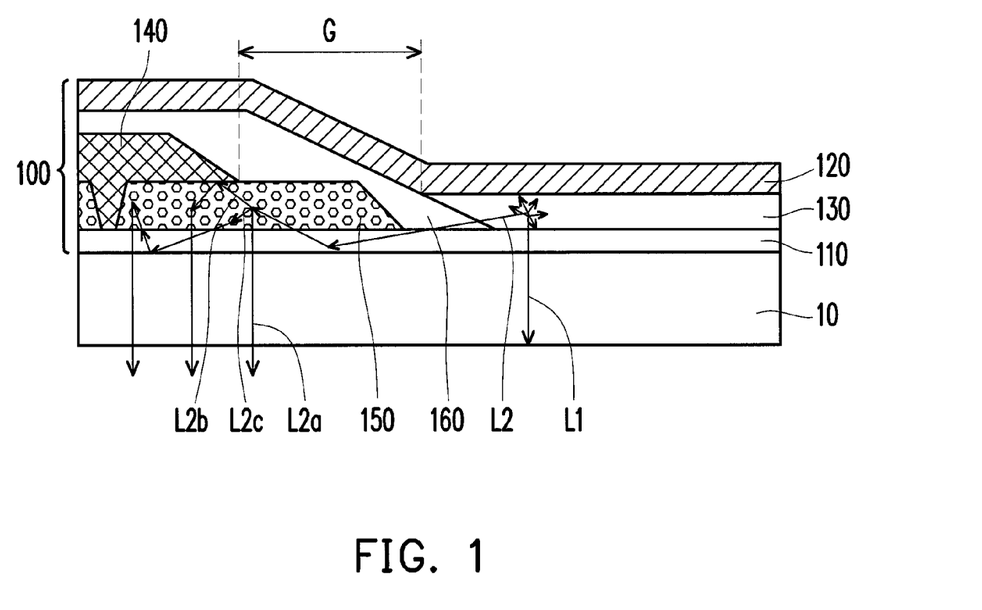
FIG. 1 illustrates an organic electroluminescent (OEL) lighting element according to an embodiment of the application.

In order to accomplish favorable illumination effects and provide a large illumination area, the total internal reflection (TIR) phenomenon of an organic electroluminescent (OEL) lighting element need be restrained, and non-illuminative regions in the OEL lighting element need be reduced. Accordingly, an OEL lighting element that is capable of reducing the non-illuminative regions and has favorable luminance uniformity is provided herein. Specifically, please refer to FIG. 1 which illustrates an OEL lighting element according to an embodiment of the application. As shown in FIG. 1, the OEL lighting element 100 is suitable for being disposed on a substrate 10 and includes a first electrode 110, a second electrode 120, an OEL layer 130, an auxiliary electrode 140, a patterned scattering layer 150, and a patterned dielectric layer 160. The layout for the OEL lighting element 100 is well known by a person of ordinary skill in the art and can be modified depending on the requirement, and thus it is not described in detail herein.

The second electrode 120 is opposite to the first electrode 110. The OEL layer 130 is disposed between the first electrode 110 and the second electrode 120. The auxiliary electrode 140 is also disposed between the first electrode 110 and the second electrode 120 and electrically connected to the first electrode 110. There is a gap G between the auxiliary electrode 140 and the OEL layer 130. The patterned scattering layer 150 is disposed between the first electrode 110 and the auxiliary electrode 140 and covers a portion of the auxiliary electrode 110. The first electrode 110 has a first refraction index, and the patterned scattering layer 150 has a second refraction index. Here, the second refraction index is greater than or substantially equal to the first refraction index. The patterned dielectric layer 160 is disposed between the auxiliary electrode 140 and the second electrode 120. The patterned dielectric layer 160 covers the auxiliary electrode 140 and is disposed between the auxiliary electrode 140 and the OEL layer 130.

In this embodiment, the first electrode 110 is, for instance, a transparent electrode, and a material of the first electrode 110 includes a transparent conductive material, such as indium tin oxide (ITO), indium zinc oxide (IZO), or aluminum zinc oxide (AZO). Light L1 emitted from the OEL layer 130 can pass through the first electrode 110 and the substrate 10 and serve as the illumination light source. However, the refraction index of the transparent electrode is different from that of the substrate 10. Particularly, the refraction index of the transparent electrode is greater than that of the substrate 10. Therefore, lateral light L2 cannot be emitted out of the substrate 10 due to the TIR phenomenon occurring in the interface between the first electrode 110 and the substrate 10. As such, the light L2 may not be able to serve as an illumination light source, thus leading to unfavorable external efficiency of the OEL lighting element 100.

To resolve said issue, the patterned scattering layer 150 is configured next to the OEL layer 130 in the OEL lighting element 100 according to this embodiment. The OEL layer 130 and the patterned scattering layer 150 are substantially located on the same plane, and the second refraction index of the patterned scattering layer 150 is greater than or substantially equal to the first refraction index of the first electrode 110. Hence, the TIR phenomenon does not occur when the light L2 enters the patterned scattering layer 150 from the first electrode 110. Namely, the light L2 that undergoes the total reflection occurring in the interface between the first electrode 110 and the substrate 10 is able to enter the patterned scattering layer 150.

The patterned scattering layer 150 allows the lateral light L2 emitted from the OEL layer 130 to be scattered. Therefore, the scattered light L2a (scattered by the patterned scattering layer 150) may pass through the substrate 10 and act as an illumination light source, so as to improve the external efficiency of the OEL lighting element 100.

In this embodiment, the auxiliary electrode 140 is made of a conductive light-shielding material (e.g., metal), for instance, and the patterned scattering layer 150 and the auxiliary electrode 140 are stacked together. Accordingly, the scattered light L2b that is scattered by the patterned scattering layer 150 is reflected and does not pass through the auxiliary electrode 140. At this time, the reflected scattered light L2b can be scattered by the patterned scattering layer 150 again, and then the reflected scattered light L2b can pass through the substrate 10 and serve as an illumination light source.

To be more specific, the scattered light L2c that is scattered by the patterned scattering layer 150 may undergo the TIR occurring in the interface between the first electrode 110 and the substrate 10 once again and further enter the patterned scattering layer 150. At this time, the scattered light L2c that undergoes the TIR can be scattered by the patterned scattering layer 150, and the reflected scattered light L2c can still pass through the substrate 10 and serve as an illumination light source. As a result, due to the patterned scattering layer 150, the lateral light L2 emitted from the OEL layer 130 can still pass through the substrate 10 without being affected by the TIR phenomenon occurring in the interface between the first electrode 110 and the substrate 10. Thereby, the OEL lighting element 100 can have satisfactory external efficiency.

It should be mentioned that the OEL lighting element 100 emits light through the OEL layer 130. However, there is no OEL layer 130 at a location where the auxiliary electrode 140 is disposed. Subject to this structural design, a dark zone that cannot emit light may exist in the OEL lighting element 100. Unfortunately, according to this embodiment, the area coverage of the auxiliary electrode 140 falls within the area coverage of the patterned scattering layer 150, and the patterned scattering layer 150 allows the light L2 to be scattered, such that the light L2 can pass through the substrate 10. Hence, even though no OEL layer 130 is configured at the location where the auxiliary electrode 140 is exposed, light can be emitted from the location where the auxiliary electrode 140 is exposed according to this embodiment. In other words, the area of the non-illuminative dark zone in the OEL lighting element 100 is significantly reduced, and the OEL lighting element 100 can provide an even and uniform light source for illumination.

Certainly, in this embodiment, the OEL lighting element 100 is not limited to be the illumination light source; in other embodiments of the application, the OEL lighting element 100 is also applicable to other designs that require the even and uniform light source. The OEL lighting element 100 may be bottom-emissive or top-emissive, which should not be construed as a limitation to this application. In this embodiment, the OEL lighting element 100 is bottom-emissive, and the first electrode 110 in the OEL lighting element 100 is configured next to the substrate 10, which should not be construed as limitations to the application. In another embodiment, the OEL lighting element 100 may be top-emissive, and the second electrode 120 in the OEL lighting element 100 is configured next to the substrate 10. The structure and the way to stack components as shown in FIG. 1 are merely exemplary and should not be construed as limitations to the application. An array constituted by OEL lighting elements is further described below. The OEL lighting elements 100 may be connected in a serial manner, a parallel manner, or a matrix manner in order to form an OEL lighting element array. However, the application is not limited thereto. The OEL lighting elements 100 may be arranged to form a passive array or an active array (by adding active control devices), and the arrangement of the OEL lighting elements 100 is not limited in the application.

Figure 2A:
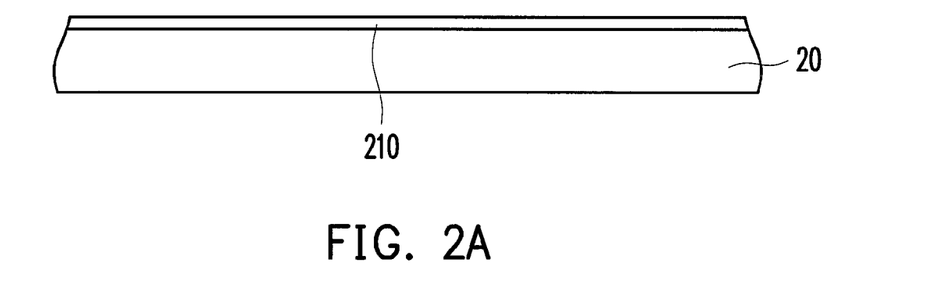
FIG. 2A to FIG. 2G illustrate a process of manufacturing an OEL lighting element array according to a first embodiment of the application.
Figure 2B:
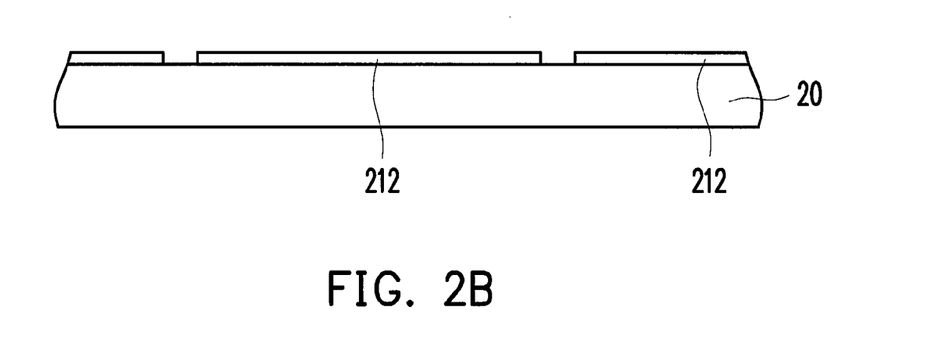

FIG. 2A to FIG. 2G illustrate a process of manufacturing an OEL lighting element array according to a first embodiment of the application. Here, the OEL lighting elements in the OEL lighting element array are serially connected, for instance. With reference to FIG. 2A, a transparent conductive layer 210 is formed on a substrate 20. In this embodiment, the substrate 20 is a transparent substrate, and a material of the transparent conductive layer 210 includes ITO, IZO, or AZO. With reference to FIG. 2B, a patterning process is performed, such that the transparent conductive layer 210 is patterned to form a plurality of first electrodes 212 separated from one another. The patterning process can be a photolithography and etching process (PEP) or any other appropriate process.

Figure 2C:
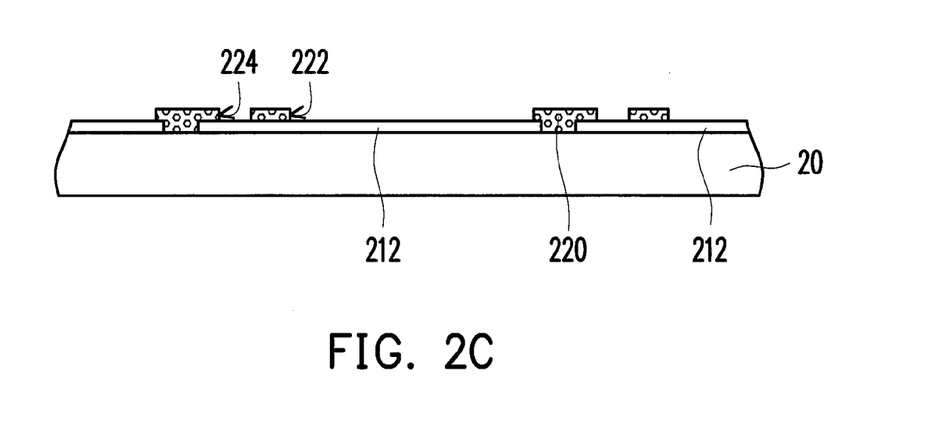

With reference to FIG. 2C, the first electrodes 212 are separated from one another, and thus the gap between any two adjacent first electrodes 212 can expose the underlying substrate 20. Hence, the patterned scattering layer 220 is formed among the first electrodes 212 on the substrate 20. The patterned scattering layer 220 can have a mesh pattern or other patterns, which should not be construed as a limitation to the application. The patterned scattering layer 220 has a plurality of openings 222 and a plurality of contact holes 224. Each of the openings 222 respectively exposes one of the first electrodes 212, and each of the contact holes 224 respectively exposes one of the first electrodes 212 as well. Since FIG. 2C shows the cross-sectional structure of the OEL lighting element array, the patterned scattering layer 220 is partially illustrated. To be more specific, the patterned scattering layer 220 is substantially located on edge portions of the first electrodes 212 and can surround the separated first electrodes 212. In addition, the first electrodes 212 of this embodiment have a first refraction index, and the patterned scattering layer 220 can be constituted by a white or an ivory paste having a second refraction index. Here, the second refraction index is greater than or substantially equal to the first refraction index. In an embodiment of the application, micro-particles or nano-particles can be distributed in the patterned scattering layer 220. The micro-particles or the nano-particles may be made of $SiO_2$, $TiO_2$, $ZrO_2$, or polymer particles, so as to improve the scattering capability of the patterned scattering layer 220. However, the application is not limited thereto.

Figure 2D:
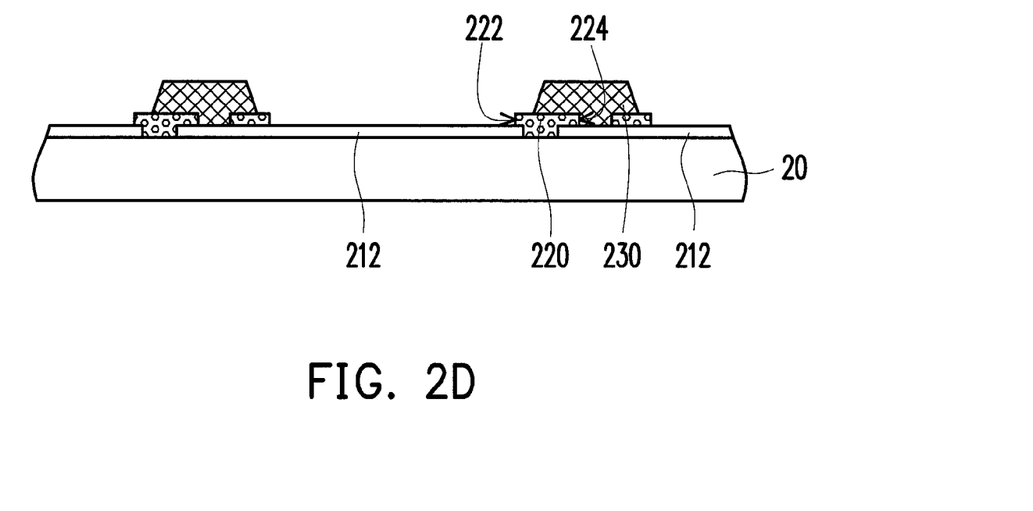

With reference to FIG. 2D, a plurality of auxiliary electrodes 230 are formed on the substrate 20. The auxiliary electrodes 230 are separately disposed on the patterned scattering layer 220, and each of the auxiliary electrodes 230 is electrically connected to one of the first electrodes 212 through a corresponding contact hole 224.

Figure 2E:
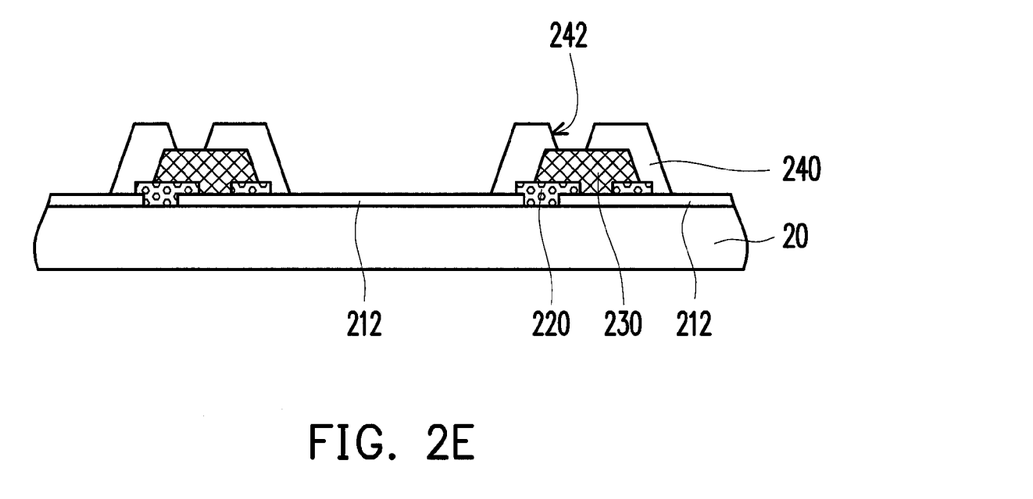

With reference to FIG. 2E, a patterned dielectric layer 240 is formed on the substrate 20 to cover the auxiliary electrodes 230, and the patterned dielectric layer 240 has a plurality of contact holes 242. Each of the contact holes 242 respectively exposes one of the auxiliary electrodes 230. Here, the patterned dielectric layer 240 is also located on edge portions of the first electrodes 212, for instance.

Figure 2F:
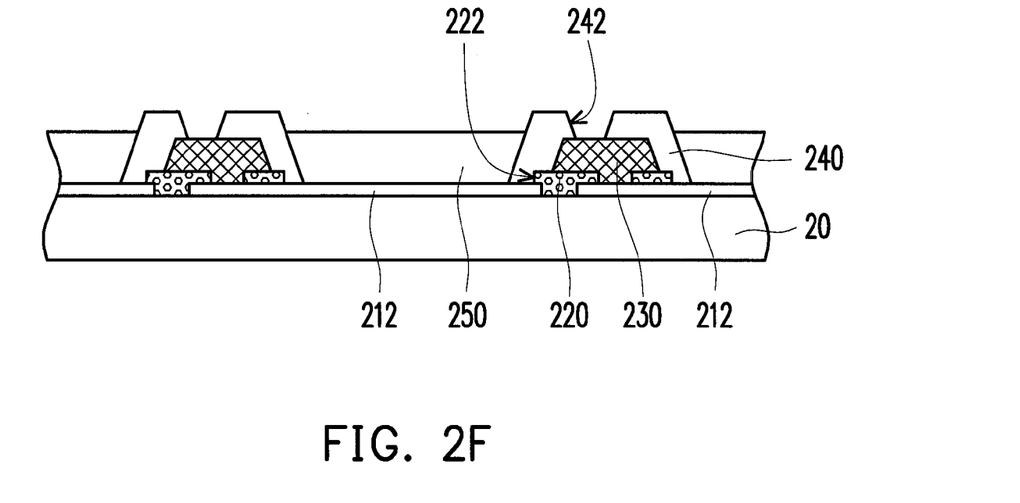

With reference to FIG. 2F, a plurality of OEL layers 250 are formed on the substrate 20. Each of the OEL layers 250 is respectively disposed in one of the openings 222 of the patterned scattering layer 220 and located on one of the first electrodes 212. Namely, the OEL layers 250 are disposed on the first electrodes 212 exposed by the patterned scattering layer 220, and thus the patterned scattering layer 220 and the OEL layers 250 are located at substantially the same level. The material of the OEL layers 250 is well-known to people having ordinary skill in the pertinent art, and thus no further descriptions are provided herein.

Figure 2G:
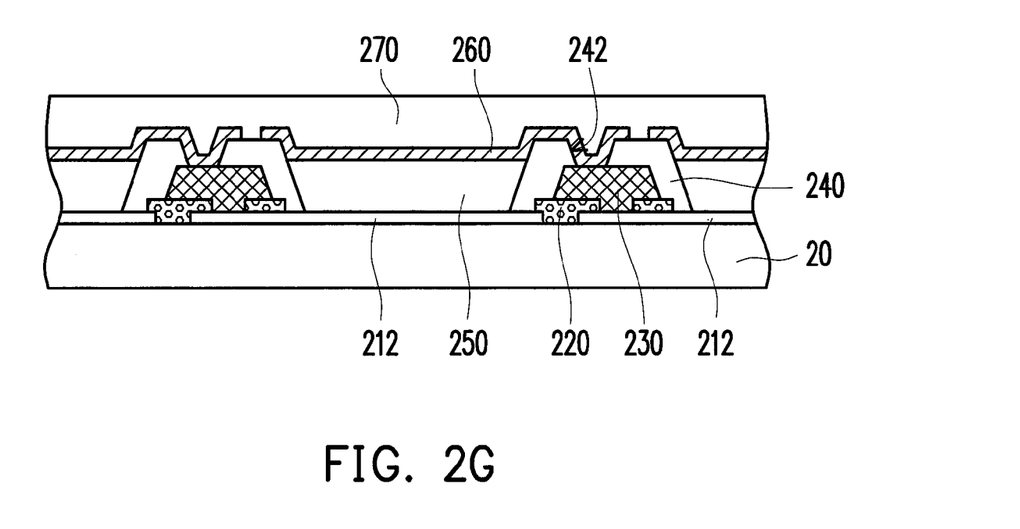

With reference to FIG. 2G, a plurality of second electrodes 260 are formed on the OEL layers 250 and the patterned dielectric layer 240, and a passivation layer 270 can be formed on the second electrodes 260 to cover the second electrodes 260 and the patterned dielectric layer 240. So far, the OEL lighting element array 200 is formed.

In this embodiment, each of the second electrodes 260 is respectively disposed on one of the OEL layers 250 and extends above one of the auxiliary electrodes 230 adjacent thereto, and each of the second electrodes 260 is electrically connected to the one of the auxiliary electrode 230 through one of the contact holes 242 in the patterned dielectric layer 240. In particular, each of the second electrodes 260 is electrically insulated from one of the first electrodes 212 underlying, and each of the second electrodes 260 is electrically connected to one of the first electrodes 212 adjacent thereto through one of the auxiliary electrodes 230. The stacked structure containing the first electrodes 212, the OEL layers 250, and the second electrodes 260 can be considered an OEL unit. Hence, the OEL lighting element array 200 described in this embodiment is an array constituted by serially connecting a plurality of OEL units, for instance. Certainly, the application is not limited thereto. According to other embodiments of the application, the OEL units can be connected in parallel to form an array. A material of the second electrodes 260 includes metal, and therefore the OEL lighting element array 200 has a bottom-emissive design, for instance.

It should be mentioned that the OEL lighting element array 200 described in the embodiments of the application has the patterned scattering layer 220. The OEL layers 250 and the patterned scattering layer 220 are located at substantially the same level, and thus the function of the patterned scattering layer 220 is substantially the same as that of the patterned scattering layer 150 of the aforesaid OEL lighting element 100. That is to say, the light laterally transmitted from the OEL layers 250 is scattered by the patterned scattering layer 220 and thus can pass through the substrate 20. Thereby, the area of the dark zone in the OEL lighting element array 200 can be significantly reduced, and the OEL lighting element array 200 can have satisfactory external efficiency. Besides, the OEL lighting element array 200, when acting as an illumination light source, can achieve favorable illumination effects.

Figure 3:
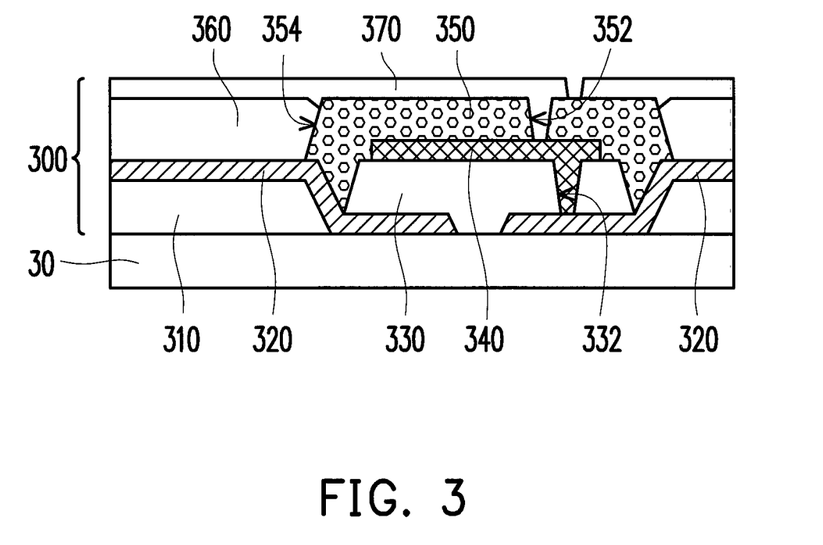
FIG. 3 is a schematic cross-sectional view illustrating an OEL lighting element array according to a second embodiment of the application.

FIG. 3 is a schematic cross-sectional view illustrating an OEL lighting element array according to a second embodiment of the application. With reference to FIG. 3, an OEL lighting element array 300 is suitable for being configured on a substrate 20. The OEL lighting element array 300 includes a pad layer 310, a plurality of first electrodes 320, a patterned dielectric layer 330, a plurality of auxiliary electrodes 340, a patterned scattering layer 350, a plurality of OEL layers 360, and a plurality of second electrodes 370.

The pad layer 310 is disposed on the substrate 30. The first electrodes 320 are separately disposed on the pad layer 310 and the substrate 30. The patterned dielectric layer 330 covers the substrate 30 among the first electrodes 320 and is located on edge portions of the first electrodes 320. The auxiliary electrodes 340 are separately disposed on the patterned dielectric layer 330. The patterned scattering layer 350 is disposed among the first electrodes 320 and covers the auxiliary electrodes 340. Each of the OEL layers 360 is respectively disposed on one of the first electrodes 320. The second electrodes 370 are disposed on the OEL layers 360 and the patterned scattering layer 350. Each of the second electrodes 370 is respectively disposed on one of the OEL layers 360 and extends above one of the auxiliary electrode 340s.

Specifically, the patterned dielectric layer 330 has a plurality of first contact holes 332, and each of the first contact holes 332 respectively exposes one of the first electrodes 320. Thereby, each of the auxiliary electrodes 340 is electrically connected to a corresponding first electrode 320 through one of the first contact holes 332, respectively. Moreover, the patterned scattering layer 350 has a plurality of second contact holes 352, and each of the second contact holes 352 respectively exposes one of the auxiliary electrodes 340. Hence, each of the second electrodes 370 may be electrically connected to one of the auxiliary electrodes 340 through one of the second contact holes 352.

According to this embodiment, the stacked structure containing the first electrodes 320, the OEL layers 360, and the second electrodes 370 can be defined as an OEL unit. Each of the second electrodes 370 is electrically connected to one of the auxiliary electrodes 340 through one of the second contact holes 352, and the one of the auxiliary electrode 340 can be connected to one of the first electrodes 320 in the adjacent OEL unit through one of the first contact holes 332. In other words, according to this embodiment, each of the second electrodes 370 is electrically insulated from the one of the first electrodes 320 underlying, and each of the second electrodes 370 is electrically connected to one of the first electrode 320 adjacent thereto through one of the auxiliary electrodes 340. Hence, the OEL lighting element array 300 described in this embodiment may be considered an array constituted by serially connecting a plurality of OEL units. Certainly, the application is not limited thereto. According to other embodiments of the application, the OEL units can be connected in parallel or in another manner to form an array.

Besides, the first electrodes 320 of this embodiment include reflective electrodes, and a material of the first electrodes 320 includes metal. A material of the second electrodes 370 includes a transparent conductive material, such as ITO, IZO, or AZO. Thus, the OEL lighting element array 300 has a top-emissive design. According to an embodiment of the application, the OEL lighting element array 300 may further include a passivation layer (not shown) that covers the second electrodes 370 and the patterned scattering layer 350 for the purpose of protection.

Specifically, the design of the OEL lighting element array 300 described in this embodiment is similar to the design of the OEL lighting element array 200 described in the first embodiment. The patterned scattering layer 350 of this embodiment may have a mesh pattern, which should not be construed as a limitation to the application. The openings 354 of the patterned scattering layer 350 respectively expose the first electrodes 320, and each of the OEL layers 360 is respectively disposed in one of the openings 354.

Since the first electrodes 320 exposed by the openings 354 are located on the pad layer 310, and the patterned scattering layer 350 covering the auxiliary electrodes 340 is located on the patterned dielectric layer 330, the OEL layers 360 and the patterned scattering layer 350 are located at substantially the same levels. Hence, the patterned scattering layer 350 allows the lateral light emitted from the OEL layers 360 to be scattered. A material of the auxiliary electrodes 340 includes a conductive light-shielding material (e.g., metal). Therefore, the patterned scattering layer 350 and the patterned scattering layer 150 described in the above embodiment have the same function, and the patterned scattering layer 350 is conducive to improvement of external efficiency of the OEL lighting element array 300.

In light of the foregoing, the patterned scattering layer is configured among a plurality of OEL units, so as to scatter the lateral light emitted from the OEL layers. Thereby, the lateral light emitted from the OEL layers can still be utilized and is not affected by the TIR phenomenon occurring on surfaces of the electrodes. As a result, the OEL lighting element and an array constituted by the OEL lighting elements can have satisfactory external efficiency. Moreover, the configuration of the patterned scattering layer allows light to be emitted from a location where the auxiliary electrode is disposed. Thus, no dark zone exists at the location where the auxiliary electrode is disposed, and light emission is rather even and uniform.

It will be apparent to those skilled in the art that various modifications and variations can be made to the structure of the application without departing from the scope or spirit of the application. In view of the foregoing, it is intended that the application cover modifications and variations of this application provided they fall within the scope of the following claims and their equivalents.

What is claimed is:

1. An organic electroluminescent lighting element array disposed on a substrate, the organic electroluminescent lighting element comprising:
    a plurality of first electrodes separately disposed on the substrate, the first electrodes having a first refraction index;
    a patterned scattering layer disposed among the first electrodes on the substrate and located on edge portions of the first electrodes, wherein the patterned scattering layer has a second refraction index, and the second refraction index is greater than or substantially equal to the first refraction index;
    a plurality of auxiliary electrodes separately disposed on the patterned scattering layer, each of the auxiliary electrodes being electrically connected to one of the first electrodes, respectively;
    a patterned dielectric layer covering the auxiliary electrodes and having a plurality of contact holes, each of the contact holes respectively exposing one of the auxiliary electrodes;
    a plurality organic electroluminescence layers, each of the organic electroluminescence layers being respectively disposed on one of the first electrodes; and
    a plurality of second electrodes disposed on the organic electroluminescence layers, each of the second electrodes being respectively disposed on one of the organic electroluminescence layers and extending above one of the auxiliary electrodes adjacent thereto, and each of the second electrodes being electrically connected to the one of the auxiliary electrodes adjacent thereto by one of the contact holes.

2. The organic electroluminescent lighting element array as recited in claim 1, wherein the first electrodes comprise transparent electrodes.

3. The organic electroluminescent lighting element array as recited in claim 1, wherein a material of the first electrodes comprises indium tin oxide, indium zinc oxide, or aluminum zinc oxide.

4. The organic electroluminescent lighting element array as recited in claim 1, wherein the patterned scattering layer has a mesh pattern and a plurality of openings, each of the openings respectively exposes one of the first electrodes, and each of the organic electroluminescence layers is respectively disposed in one of the openings.

5. The organic electroluminescent lighting element array as recited in claim 4, wherein the patterned scattering layer scatters lateral light emitted from the organic electroluminescence layers.

6. The organic electroluminescent lighting element array as recited in claim 1, wherein a material of the auxiliary electrodes comprises a conductive light-shielding material.

7. The organic electroluminescent lighting element array as recited in claim 1, wherein each of the second electrodes is electrically insulated from one of the first electrodes underlying, and each of the second electrodes is electrically connected to one of the first electrodes adjacent thereto through one of the auxiliary electrodes.

8. The organic electroluminescent lighting element array as recited in claim 1, wherein a material of the second electrodes comprises metal.

9. The organic electroluminescent lighting element array as recited in claim 1, further comprising a passivation layer covering the second electrodes and the patterned dielectric layer.

10. An organic electroluminescent lighting element array disposed on a substrate, the organic electroluminescent lighting element array comprising:
    a pad layer disposed on the substrate;
    a plurality of first electrodes separately disposed on the pad layer and the substrate;
    a patterned dielectric layer covering the substrate among the first electrodes and disposed on edge portions of the first electrodes, wherein the patterned dielectric layer has a plurality of first contact holes, and each of the first contact holes respectively exposes one of the first electrodes;
    a plurality of auxiliary electrodes separately disposed on the patterned dielectric layer, each of the auxiliary electrodes being electrically connected to a corresponding first electrode of the first electrodes through one of the first contact holes, respectively;
    a patterned scattering layer disposed among the first electrodes and covering the auxiliary electrodes, wherein the patterned scattering layer has a plurality of second contact holes, and each of the second contact holes respectively exposes one of the auxiliary electrodes;

a plurality organic electroluminescence layers, each of the organic electroluminescence layers being respectively disposed on one of the first electrodes; and a plurality of second electrodes disposed on the organic electroluminescence layers and the patterned scattering layer, each of the second electrodes being respectively disposed on one of the organic electroluminescence layers and extending above one of the auxiliary electrodes adjacent thereto, and each of the second electrodes being electrically connected to the one of the auxiliary electrodes adjacent thereto through one of the second contact holes.

11. The organic electroluminescent lighting element array as recited in claim 10, wherein the first electrodes comprise reflective electrodes.

12. The organic electroluminescent lighting element array as recited in claim 10, wherein a material of the first electrodes comprises metal.

13. The organic electroluminescent lighting element array as recited in claim 10, wherein the patterned scattering layer has a mesh pattern and a plurality of openings, each of the openings respectively exposes one of the first electrodes, and each of the organic electroluminescence layers is respectively disposed in one of the openings.

14. The organic electroluminescent lighting element array as recited in claim 13, wherein the patterned scattering layer scatters lateral light emitted from the organic electroluminescence layers.

15. The organic electroluminescent lighting element array as recited in claim 10, wherein a material of the auxiliary electrodes comprises a conductive light-shielding material.

16. The organic electroluminescent lighting element array as recited in claim 10, wherein each of the second electrodes is electrically insulated from one of the first electrodes underlying, and each of the second electrodes is electrically connected to one of the first electrodes adjacent thereto through one of the auxiliary electrodes.

17. The organic electroluminescent lighting element array as recited in claim 10, wherein a material of the second electrodes comprises indium tin oxide, indium zinc oxide, or aluminum zinc oxide.

18. The organic electroluminescent lighting element array as recited in claim 10, further comprising a passivation layer covering the second electrodes and the patterned scattering layer.

* * * * *